United States Patent
Morita et al.

(10) Patent No.: US 7,956,784 B2
(45) Date of Patent: Jun. 7, 2011

(54) DA CONVERTER INCLUDING CONVERSION AMPLIFIER HAVING OUTPUT VOLTAGE WITH IMPROVED LINEARITY

(75) Inventors: Kouji Morita, Saitama (JP); Naoaki Sugimura, Tokyo (JP); Masaru Sekiguchi, Saitama (JP)

(73) Assignee: Oki Semiconductor Co., Ltd, Tokyo (JP)

( * ) Notice: Subject to any disclaimer, the term of this patent is extended or adjusted under 35 U.S.C. 154(b) by 26 days.

(21) Appl. No.: 12/503,903

(22) Filed: Jul. 16, 2009

(65) Prior Publication Data
US 2010/0026540 A1   Feb. 4, 2010

(30) Foreign Application Priority Data
Jul. 31, 2008   (JP) .................................. 2008-197419

(51) Int. Cl.
H03M 1/66   (2006.01)
(52) U.S. Cl. ......................... 341/144; 341/135; 341/136
(58) Field of Classification Search .......... 341/135–136, 341/144
See application file for complete search history.

(56) References Cited

U.S. PATENT DOCUMENTS

| | | | |
|---|---|---|---|
| 6,778,119 B2 * | 8/2004 | May ............................. | 341/144 |
| 7,019,676 B2 * | 3/2006 | Ikoma et al. .................. | 341/144 |
| 7,205,920 B2 * | 4/2007 | Morrow et al. ............... | 341/144 |
| 7,535,396 B1 * | 5/2009 | Melanson ..................... | 341/144 |

FOREIGN PATENT DOCUMENTS
JP   2002-164788   6/2002

* cited by examiner

*Primary Examiner* — Khai M Nguyen
(74) *Attorney, Agent, or Firm* — Volentine & Whitt, P.L.L.C.

(57) ABSTRACT

A DA converter includes an IV conversion amplifier with output voltage having good linearity, to thus improve total harmonic distortion (THD) characteristics. In the DA converter, a first current path in which current flows due to differential switches being in the ON state in a differential switch section, and a second current path in which current flows due to differential switches being in the OFF state in the differential switch section are connected to the output side of the IV conversion amplifier. A first current flows in the first current path and a second current flows in the second current path. A current equal to the first current plus the second current that is of fixed current amount is drawn by an amplifier stage of the IV conversion amplifier.

19 Claims, 8 Drawing Sheets

DA CONVERTER INCLUDING CONVERSION AMPLIFIER HAVING OUTPUT VOLTAGE WITH IMPROVED LINEARITY

CROSS-REFERENCE TO RELATED APPLICATION

This application claims priority under 35 USC 119 from Japanese Patent Application No. 2008-197419 filed on Jul. 31, 2008, the disclosure of which is incorporated by reference herein.

BACKGROUND

1. Technical Field

The present invention relates to a digital-analogue converter (referred to as a DA converter) that converts a digital signal into an analogue signal, and in particular relates to a current cell type DA converter.

2. Related Art

Generally semiconductor integrated circuit current cell type DA converters are controlled by a digital decoder input signal switching differential switches ON or OFF based on a decoded decode signal. The output current from the current cell adjusted by the differential switch is converted into a voltage level that accords with the current by an IV (current-voltage) conversion amplifier.

An example of such a DA converter is shown in FIG. 8. The conventional DA converter 100 shown in FIG. 8 is equipped with current a decoder 112, a current cell 120 including a current source 122, a current cell array 124, and a differential switch section 126, and a current-voltage converting section 128, including two IV conversion amplifiers A101 and A102.

An N-bit decoder input signal D100 controls PMOS transistors Pw0 to Pwn, Pz0 to Pzn ($n=2^N-1$) of the differential switch section 126 by decoded decode signals S0Pw to SnPw and S0Pz to SnPz ($n=2^N-1$), switching ON the P channel MOS (PMOS) transistors Pw0 to Pwn when the differential switches are in the ON state. A current path w1, which collects together the nodes that become the current path when the differential switches are in the ON state, is connected to one of the terminals of the IV converter amplifier A101, and is connected to the output side of the IV converter amplifier A101 via a feedback resistor R102.

In a similar manner, the PMOS transistors Pz0 to Pzn are switched ON when the differential switches are in the OFF state. A current path z1, which collects together the nodes that become the current path when the differential switches are in the OFF state, is connected to one of the terminals of the IV converter amplifier A102, and is connected to the output side of the IV converter amplifier A102 via a feedback resistor R103.

Current cell output currents Iw and Iz flow through the current paths w1 and z1, and are drawn in the respective amplifier stages 144 and 145 of the IV converter amplifiers A101, A102, via the respective feedback resistors R102 and R103 of the IV converter amplifiers A101, A102.

In the DA converter 100, there are large changes in the current amount drawn by the amplifier stages 144 and 145 of the IV converter amplifiers A101, A102 accompanying increases and decreases in the current cell output currents Iw and Iz due to changes in the decode signals S0Pw to SnPw and S0Pz to SnPz. Such changes are detrimental to the linearity of the output of the IV converter amplifiers A101, A102, and distortions occur in the output voltage waveform of the IV converter amplifiers A101, A102, with a worsening in the THD (Total Harmonic Distortion) characteristics.

A differential output type DA converter is known that is provided with a folding circuit between a current cell and an IV conversion amplifier in order to obtain good linearity (see for example Japanese Patent Application Laid-Open (JP-A) No. 2002-164788).

In the technology described in JP-A No. 2002-164788 the circuit structure is made complicated by provision of the folding circuit, the DA converter scale becomes large, and a problem arises of increased current consumption.

SUMMARY

The present invention addresses the above problem and provides a DA converter that can give good linearity of output voltage of an IV conversion amplifier without providing a folding circuit, and can improve the THD characteristics.

The DA converter of the present invention includes a decoder that decodes a digital decoder input signal into a first decode signal for causing a first current to flow in a first current path and a second decode signal for causing a second current to flow in a second current path; a differential switch that outputs a current that has been output from a current source to one or other of the first current path or the second current path based on the first decode signal and the second decode signal output from the decoder; and a current-voltage converting section that outputs an analogue signal at a voltage level according to the current output from the first current path, wherein the first current path is connected to the output of the current-voltage converting section via a feedback resistor, and the second current path is connected to the output of the current-voltage converting section.

BRIEF DESCRIPTION OF THE DRAWINGS

Exemplary embodiments of the present invention will be described in detail based on the following figures, wherein.

DETAILED DESCRIPTION

First Exemplary Embodiment

Figure 1:
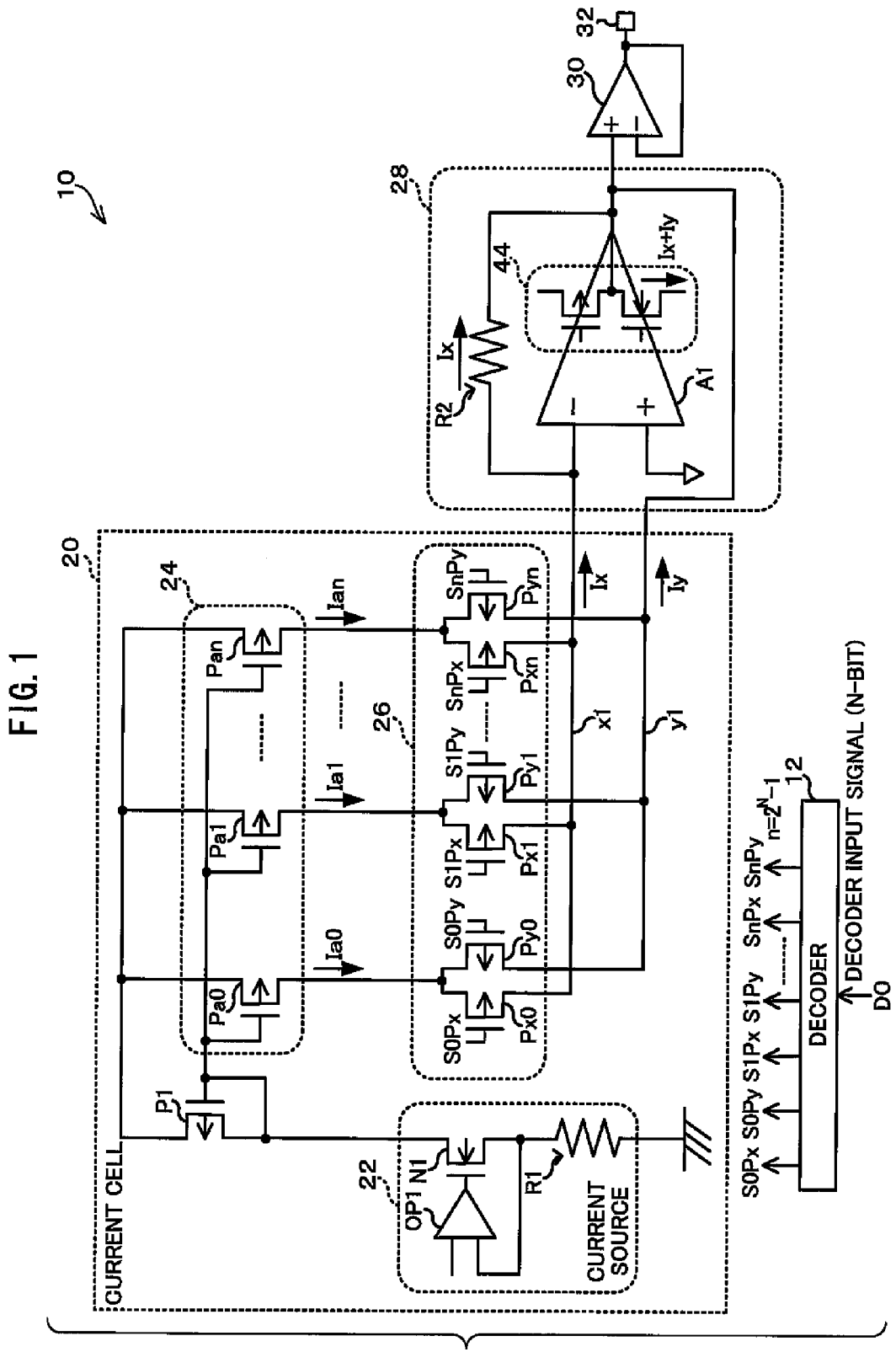
FIG. 1 is a circuit diagram showing an exemplary schematic configuration of a DA converter according to a first exemplary embodiment of the present invention.

A detailed explanation will now be given of an exemplary embodiment of the present invention, with reference to the drawings. FIG. 1 is a circuit diagram showing an exemplary schematic configuration of a DA converter 10 of the present exemplary embodiment. The DA converter 10 of the present exemplary embodiment is configured to include: a decoder 12; a current cell 20; a current-voltage converting section 28;

a buffer circuit 30; and an output terminal 32 for externally outputting a DA converted output voltage (analogue signal).

The decoder 12 outputs decode signals S0Px to SnPx (referred to collectively as decode signals SPx below) and decode signals S0Py to SnPy (referred to collectively as decode signals SPy below) ($n=2^N-1$) decoded by an N-bit decoder input signal D0. The decode signals SPx and decode signals SPy are signals for switching differential switches ON or OFF, namely, they are signals for adjusting the proportions ON or OFF of differential switches included in a differential switch section 26.

The current cell 20 is configured to include a current source 22, a current cell array 24, and the differential switch section 26.

The current source 22 is configured to include an operational amplifier OP1, an N-channel MOS (NMOS) transistor N1, and a resistor R1. The current source 22 converts an external reference voltage into current and supplies current to the current cell array 24 via a PMOS transistor P1.

The current cell array 24 is configured to include plural (n individual transistors in the present exemplary embodiment, where n=a natural number other than 0) PMOS transistors Pa0 to Pan (referred to collectively as PMOS transistors Pa below).

The differential switch section 26 is configured to include n individual differential switches. Each of the differential switches is configured by a pair of one of PMOS transistors Px0 to Pxn (referred to collectively as PMOS transistors Px below) and one of PMOS transistors Py0 to Pyn (referred to collectively as PMOS transistors Py below). The sources of the PMOS transistors Px and the PMOS transistors Py are connected to the drains of the PMOS transistors Pa. The decode signals SPx are input to the gates of the PMOS transistors Px, and the decode signals SPy are input to the gates of the PMOS transistors Py. When the differential switches are in the ON state due to the decode signals SPx and the decode signals SPy, the gates of the PMOS transistors Px are switched ON, and the gates of the PMOS transistors Py are switched OFF. The drains of the PMOS transistors Px are connected to a current path x1. When the differential switches are in the OFF state, the gates of the PMOS transistors Px are switched OFF, and the gates of the PMOS transistors Py are switched ON. The drains of the PMOS transistors Py are connected to a current path y1.

The IV converter section 28 is configured to include an IV conversion amplifier A1 that is an OP amplifier and a feedback resistor R2. The positive terminal of the IV conversion amplifier A1 is connected to a signal line, serving as a reference voltage, and the negative terminal of the IV conversion amplifier A1 is connected to the current path x1. The feedback resistor R2 is connected between the negative terminal of the IV conversion amplifier A1 and the output side thereof. The output of the IV conversion amplifier A1 is connected to the positive terminal of a buffer circuit 30, the negative terminal of the buffer circuit 30 is connected to the output side of the buffer circuit 30, and the output voltage (analogue signal) output from the buffer circuit 30 is externally output from the output terminal 32.

Figure 2:
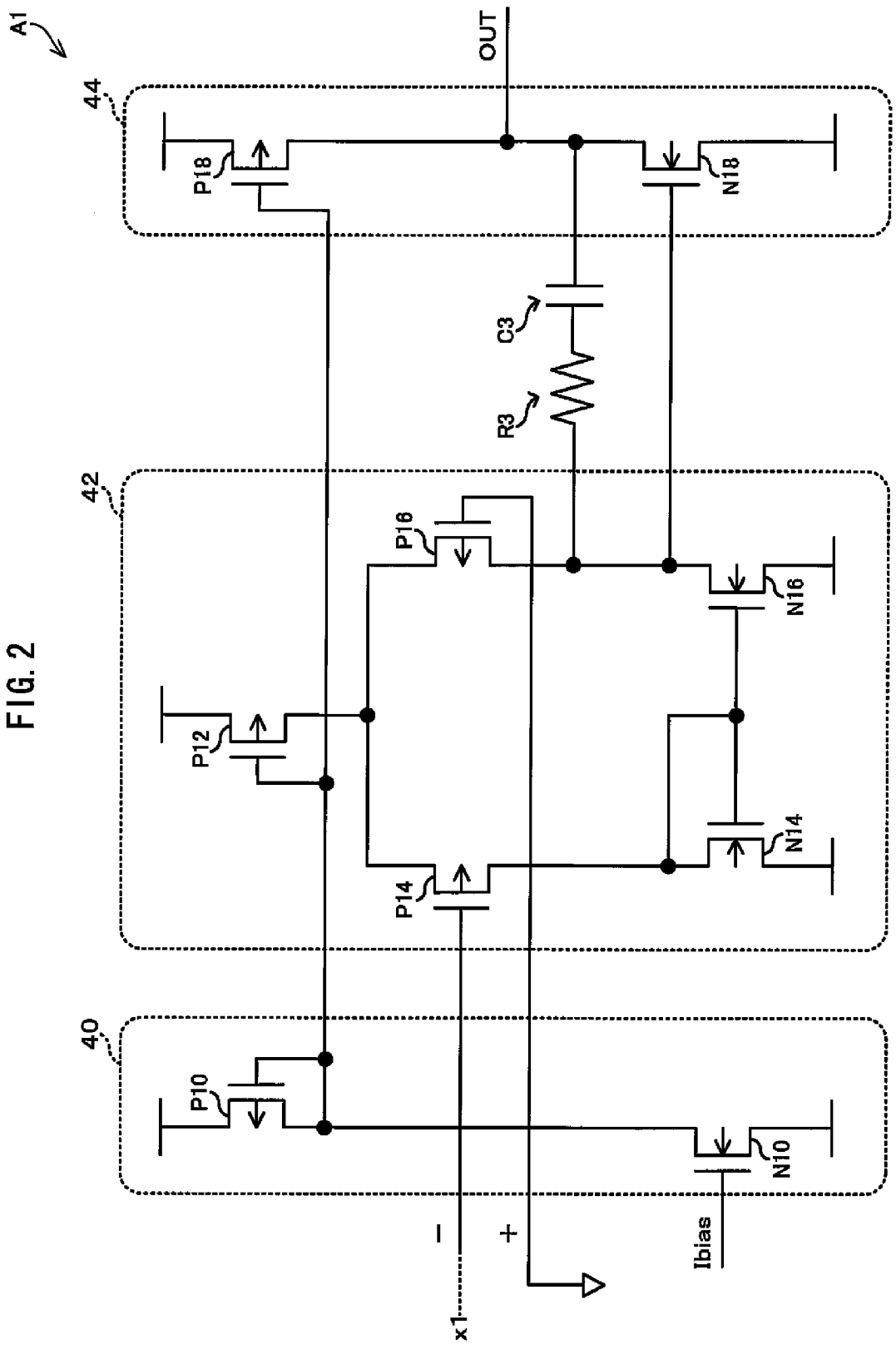
FIG. 2 is a circuit diagram showing an exemplary schematic configuration of an IV conversion amplifier A1.

An exemplary specific configuration of the IV conversion amplifier A1 will now be explained in detail, with reference to FIG. 2. FIG. 2 is a circuit diagram showing an exemplary schematic configuration of the IV conversion amplifier A1. The IV conversion amplifier A1 of the present exemplary embodiment is configured to include a buffer 40, a differential amplifier 42, an amplifier stage 44, a resistor R3, and a phase compensation capacitor C3.

The buffer 40 is configured to include a PMOS transistor P10, and an NMOS transistor N10 that has a gate connected to an Ibias and is connected in series to the PMOS transistor P10.

The differential amplifier 42 is configured to include PMOS transistors P12, P14 and P16, and NMOS transistors N14 and N16. The NMOS transistors N14 and N16 configure a current mirror. The current path x1 is connected to the gate of the PMOS transistor P14, and a signal line is connected to the gate of the PMOS transistor P16. One electrode of the PMOS transistor 12 is connected to one electrode of the PMOS transistors P14 and P16. The other electrode of the PMOS transistor P14 is connected to one electrode of the NMOS transistor N14 and the gates of the NMOS transistor N14 and N 16. The other electrode of the PMOS transistor P16 is connected to one electrode of the NMOS transistor N16. The output voltage outputs to the amplifier stage 44 via the resistor R3 and the phase compensation capacitor C3.

The amplifier stage 44 is configured to include a PMOS transistor P18 and an NMOS transistor N1 whose source is connected to the drain of the PMOS transistor P18. The output from the differential amplifier 42 is connected to between the serially connected PMOS transistor P13 and NMOS transistor N18. The gate electrode of the NMOS transistor N18 is connected to one of the electrodes of the NMOS transistor N16. The gate electrodes of the PMOS transistors P10, P12 and P18 are connected to between the PMOS transistor P10 and the NMOS transistor N10. The output voltage output from the differential amplifier 42 is amplified by the amplifier stage 44 and externally output from the IV conversion amplifier A1.

It should be noted that the IV conversion amplifier A1 is not limited to the configuration shown in FIG. 2, and there are no particular limitations to the specific configuration thereof with other configurations of OP amplifiers also applicable.

Detailed explanation will now be given of the operation of the DA converter 10 of the present exemplary embodiment.

Current is supplied to the source of the PMOS transistors Pa of the current cell array 24 by current output from the current source 22. The gates are switched ON, and currents Ia0 to Ian (referred to collectively as currents Ia below) are output from the drains of the PMOS transistors Pa to the differential switch section 26.

When input with the decoder input signal D0, which is an N-bit digital signal, the decoder 12 decodes and outputs the decode signals SPx and the decode signals SPy corresponding to the input code to the differential switch section 26.

The decode signals SPx and the decode signals SPy are input to the gates of the PMOS transistors Px and Py of the differential switch section 26, and one or other of the gates is switched ON by the input signal. When the differential switch is in the ON state, the gate of the Px is switched on, and when the differential switch is in the OFF state, the gate of the Py is switched on. Namely, one or other of the differential switches, switches ON the gate of a PMOS transistor (PMOS transistor Px or Py), and a current Ia is output from the drain thereof.

The current Ia that is output when the differential switch is in the ON state, is output to the current path x1 that collects together the nodes (drains of the PMOS transistors Px) that become the current path when the differential switch is in the ON state. Namely, a current Ix that is the sum of currents Ia for the number of differential switches that are in the ON state is output through the current path x1 to the current-voltage converting section 28. In the same manner, the current Ia that is output when the differential switch is in the OFF state, is output to the current path y1 that collects together the nodes (drains of the PMOS transistors Py) that become the current path when the differential switch is in the OFF state. Namely, a current Iy that is the sum of currents Ia for the number of differential switches that are in the OFF state is output through the current path y1 to the current-voltage converting section 28.

The current Ix flows to the output side of the IV conversion amplifier A1 of the current-voltage converter section 28 via the feedback resistor R2. The current Iy flows to the output side of the IV conversion amplifier A1 of the current-voltage converter section 28. Consequently, the current Ix+Iy is drawn in the amplifier stage 44 of the IV conversion amplifier A1. The current Ix+Iy is the sum of output current from the differential switches, which is independent of the proportion of differential switches that are in the ON state or OFF state in the differential switch section 26, and is therefore a constant value of current Ia×n. Consequently, the current Ix+Iy (current amount) drawn in the amplifier stage 44 is fixed.

In this manner, in the IV conversion amplifier A1, the current amount drawn in the amplifier stage 44 of the IV conversion amplifier A1 is fixed and is not related to the decode signals SPx and SPy.

A voltage proportional to the current Ix and the resistance value of the feedback resistor R2 is output as an output voltage from the IV converter section 28.

The output voltage that has been output from the IV converter section 28 is stabilized by the buffer circuit 30, which is voltage follower, and output externally to the DA converter 10 from the output terminal 32.

In the DA converter 10 of the present exemplary embodiment the current paths x1 and y1 are connected to the output side of the IV conversion amplifier A1, and the voltage value of the output voltage is proportional to the current Ix flowing through the current path x1 connected via the feedback resistor R2, and is not proportional to the current Iy flowing through the current path y1. There is therefore no problem of influence from changes to the current Iy.

Figure 8:
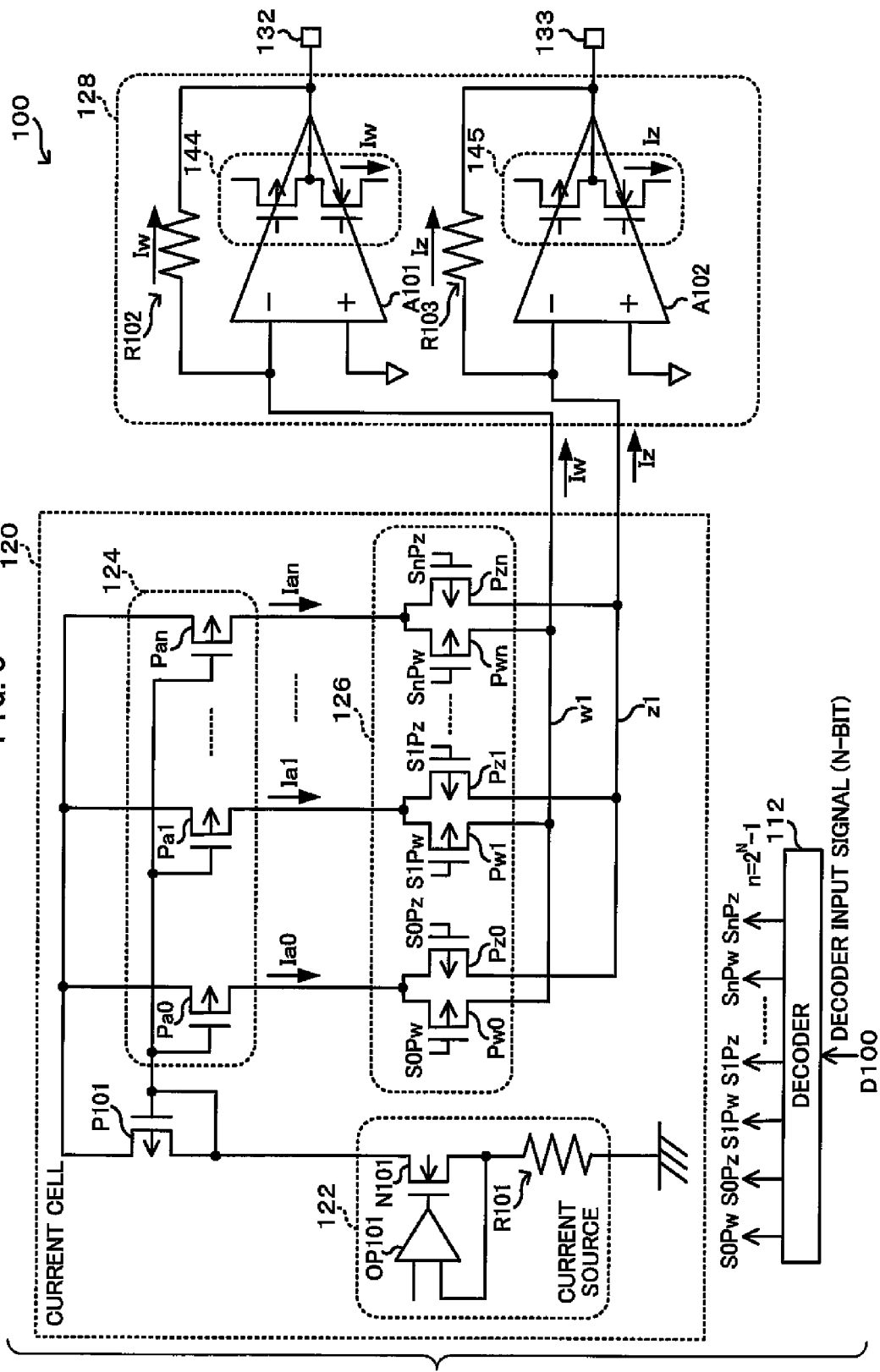
FIG. 8 is a circuit diagram showing an exemplary schematic configuration of a conventional DA converter.

As explained above, in the DA converter 10 of the present exemplary embodiment, the current path x1 in which current flows due to the differential switches of the differential switch section 26 that are in the ON state, and the current path y1 in which current flows due to the differential switches that are in the OFF state, are connected to the output side of the IV conversion amplifier A1, hence the current amount (current Ix+Iy) drawn in the amplifier stage of the IV conversion amplifier A1 is fixed and is not related to the decode signals SPx and SPy. There is therefore no detriment to the linearity of the output voltage of the IV conversion amplifier A1, no matter whether or not a folding circuit is provided, and distortion of the output voltage waveform can be suppressed. Consequently the THD characteristics can be improved. As a specific example, when the current Ix+Iy is from 0 to 300 μA (when the current Ix and the current Iy change between 0 and 300 μA), the THD characteristics of the output voltage of the IV conversion amplifier A101 in the DA converter 100 shown in FIG. 8 is −61.74 dB, however the THD characteristics of the output voltage of the IV conversion amplifier A1 of the DA converter 10 of the present exemplary embodiment is −108.6 dB, i.e. the THD characteristics can be improved.

In order to obtain a differential output with the DA converter 10 of the present exemplary embodiment, configuration may be made, for example, with one output voltage being the output voltage of the IV conversion amplifier A1, and the other output voltage being a turnover voltage that is the IV conversion amplifier A1 output voltage that has been inverted by an inverting circuit configured by an operational amplifier or the like, or other such configuration.

It should be noted that there is no limitation to the above configuration of the DA converter 10, and other configurations of DA converters are suitable as long as configuration is made such that the current paths x1 and y1 are connected to the output side of the IV conversion amplifier A1 and the current amount drawn in the amplifier stage of the IV conversion amplifier A1 is fixed (current Ix+Iy).

Figure 3:
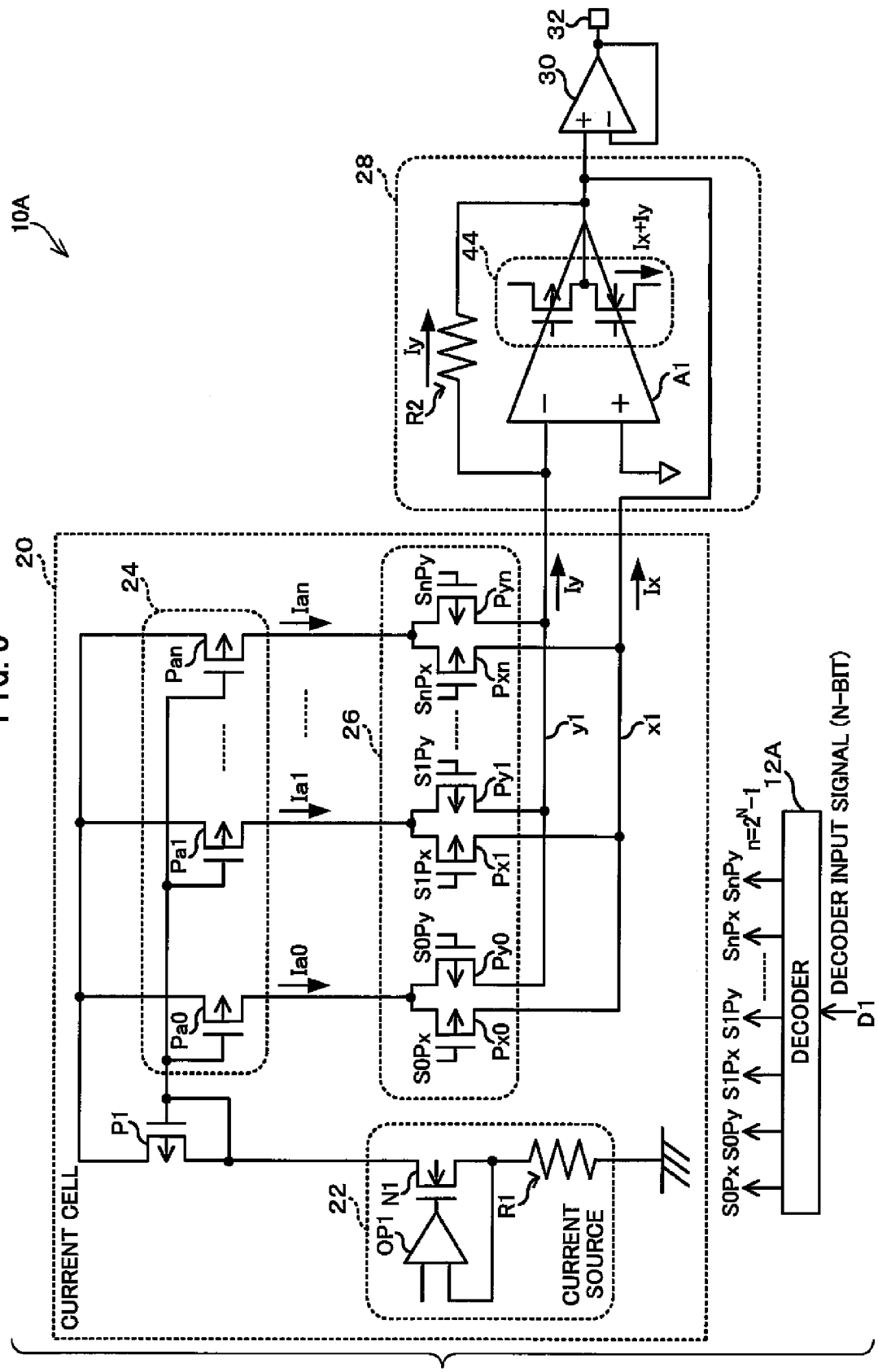
FIG. 3 is a circuit diagram for explaining another exemplary configuration of a DA converter.

For example, as in the DA converter 10A shown in FIG. 3, configuration may be made in which the current path y1 that collects together the nodes of the current paths when the differential switches of the differential switch section 26 are in the OFF state is connected to one terminal of the IV conversion amplifier A1 and to the output side of the IV conversion amplifier A1 via the feedback resistor R2, and the current path x1 that collects together the nodes of the current paths when the differential switches of the differential switch section 26 are in the ON state is connected the output side of the IV conversion amplifier A1. In such a case the output voltage is a voltage value proportional to the current Iy.

Figure 4:
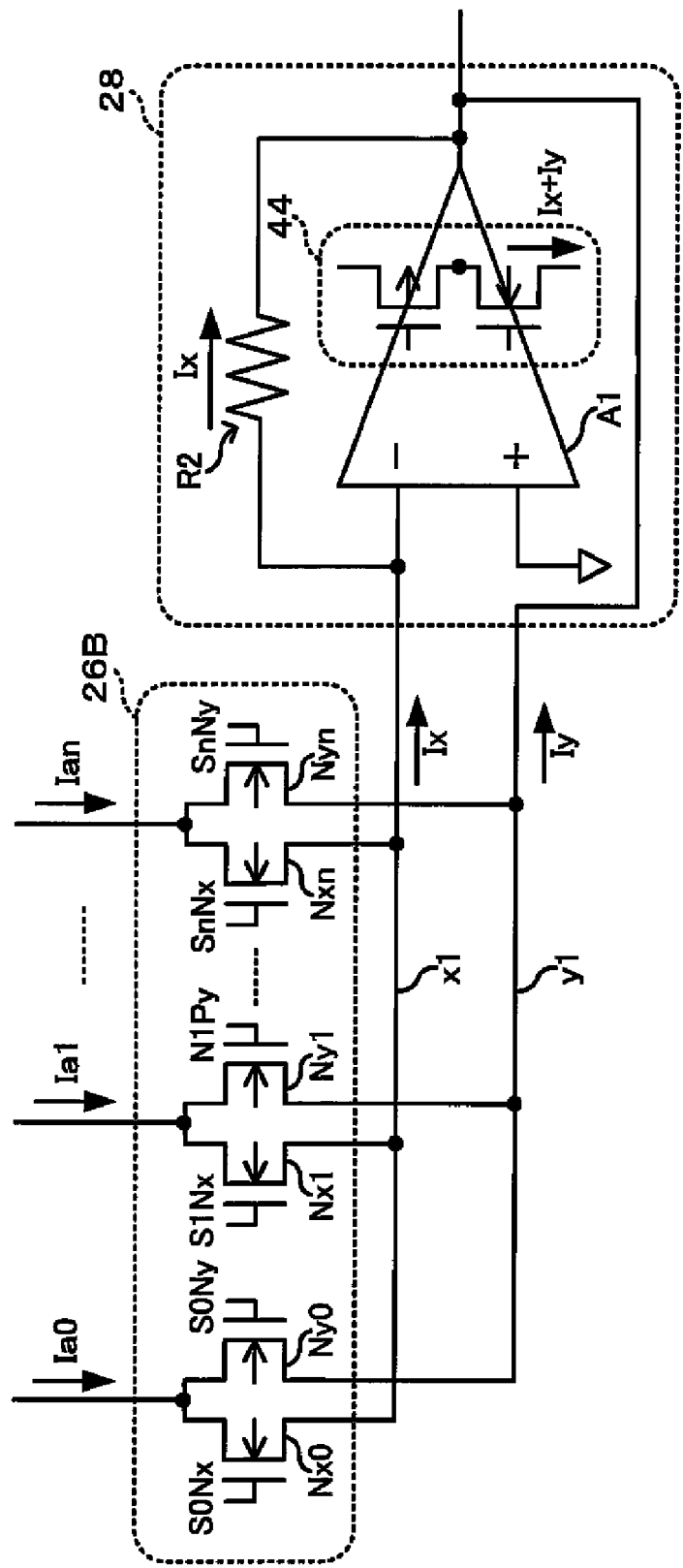
FIG. 4 is a circuit diagram for explaining another exemplary configuration of a differential switch section.
Figure 5:
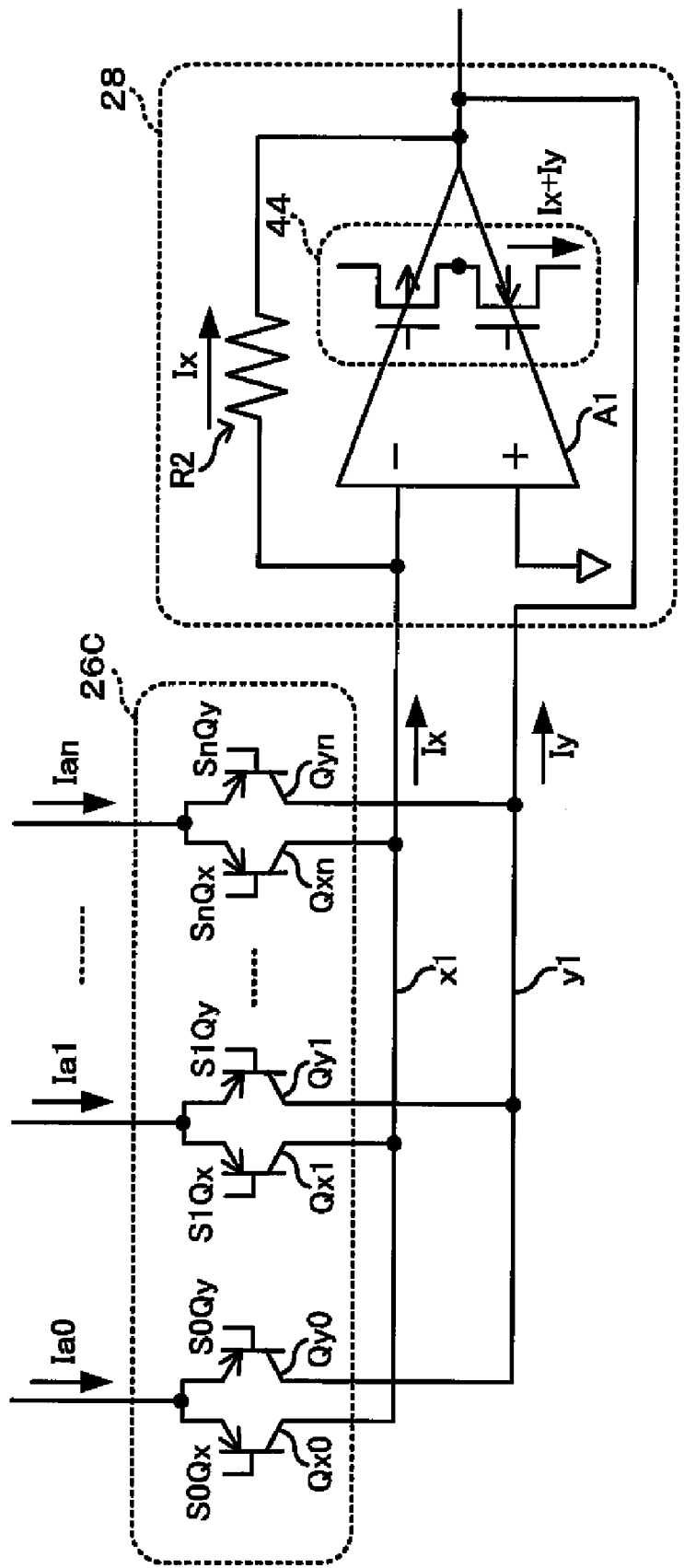
FIG. 5 is a circuit diagram for explaining another exemplary configuration of a differential switch section.

The differential switch section 26 may also be configured, like the differential switch section 26B shown in FIG. 4, with NMOS transistors (NMOS transistors Nx, Ny), or with a differential switch section (not shown in the drawings) configured by PMOS transistors and NMOS transistors. In addition, the differential switch section 26 may be configured from bipolar transistors. FIG. 5 shows a case in which a differential switch section 26C is configured by PNP junction bipolar transistors Qx and Qy. The decode signals SQx and SQy are input to the respective bases of bipolar transistors Qx and Qy, a current cell array 24 is connected to the respective emitters thereof, the respective collectors of the bipolar transistors Qx are connected to a current path x1, and the respective collectors of the bipolar transistors Qy are connected to the current path y1. It should be noted that a differential switch section (not shown in the drawings) may also be configured with NPN junction bipolar transistors.

It should be noted that when the differential switch sections are configured like those shown in FIG. 3 to FIG. 5, the decode mode of each of the decoders may be defined as being when the differential switch is switched ON (or OFF) according to the decoder input signal.

Figure 6:
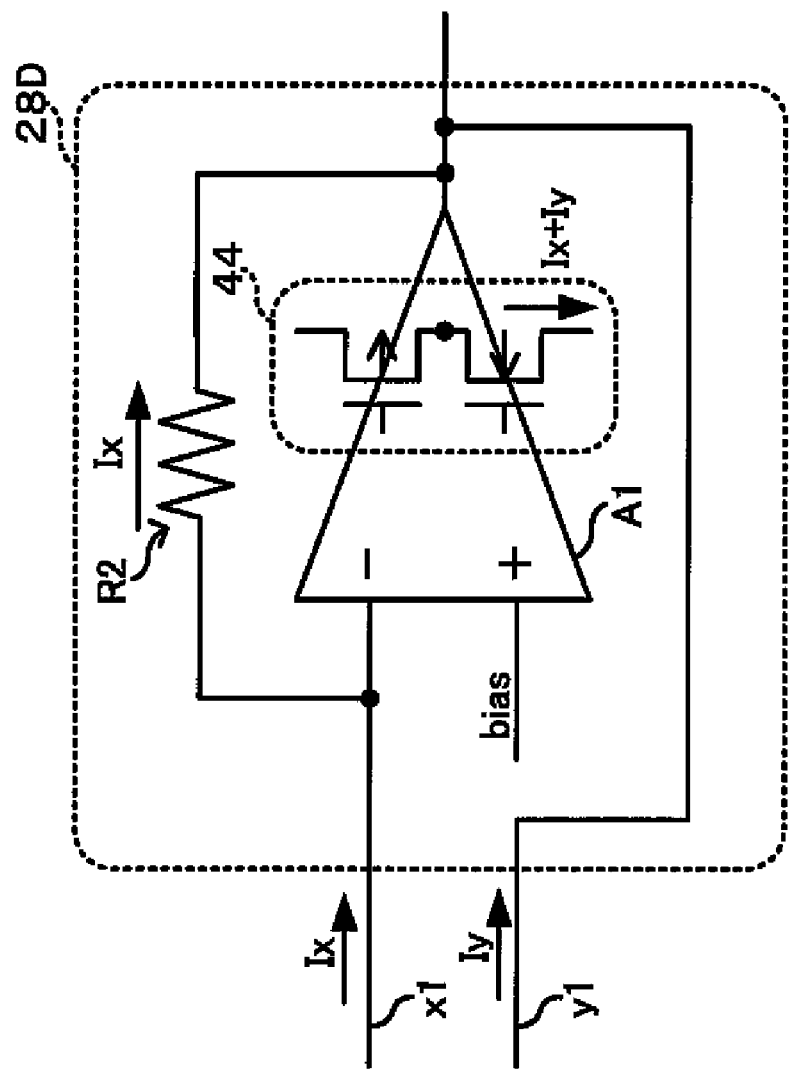
FIG. 6 is a circuit diagram for explaining another exemplary configuration of an IV conversion amplifier.

There is also no limitation of the configuration of the IV conversion amplifier A1 to the above configurations. For example, a signal ground is connected to the positive terminal that is the reference voltage of the IV conversion amplifier A1 of the present exemplary embodiment, however, there are no particular limitations and, as shown in FIG. 6, the bias ground applying a bias voltage may be connected. The current source 22 is also not limited to the above configuration. For example, the current source 22 may be configured as a current mirror using a transistor, and a configuration where an external reference current is output to the current cell array 24 may also be made, or other configurations with no particular limitation thereto. The current cell array 24 is also not limited to the configuration above. For example, the current cell array 24 may be configured from NMOS transistors and bipolar transistors, or other configurations with no particular limitation thereto.

Second Exemplary Embodiment

Figure 7:
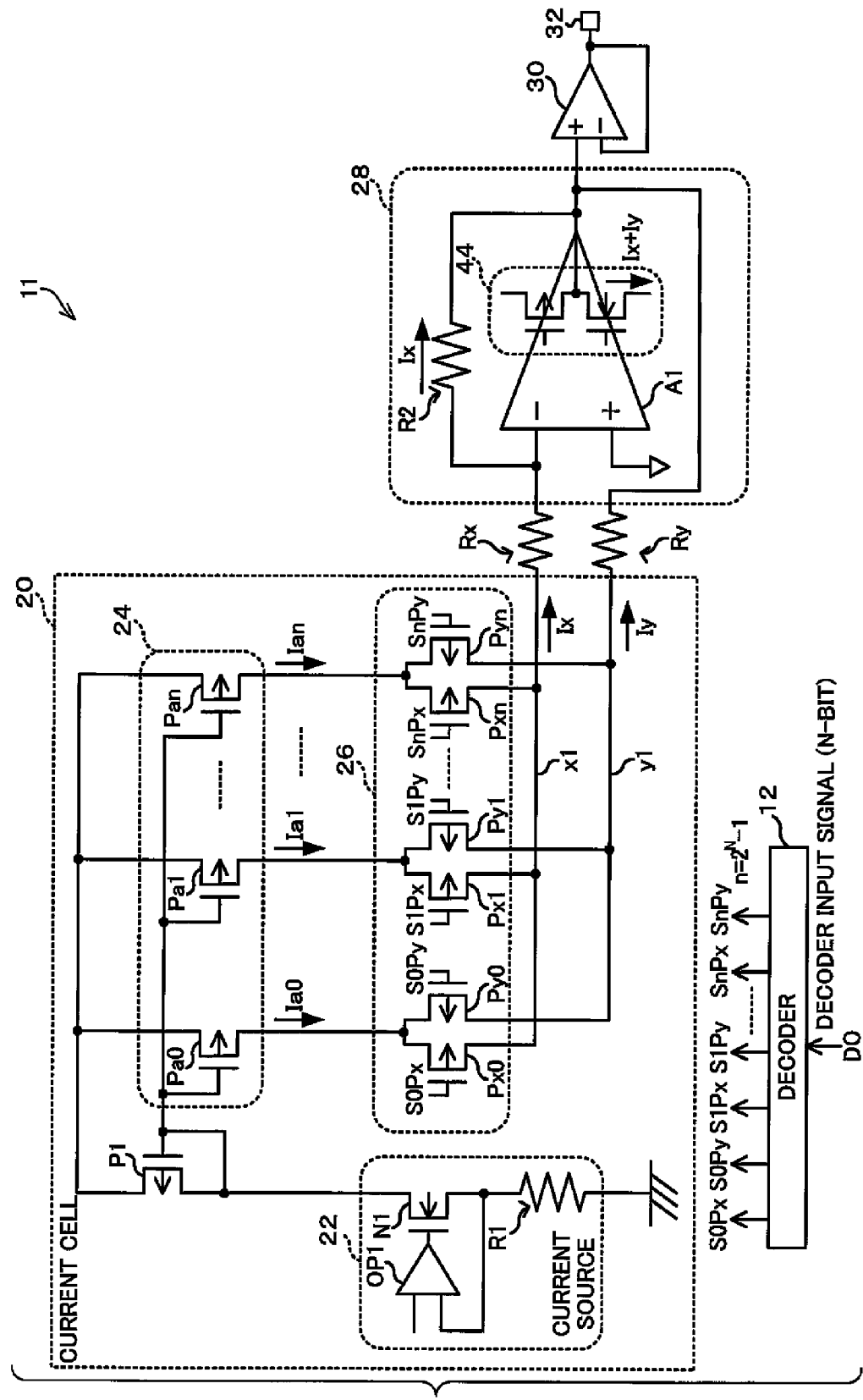
FIG. 7 is a circuit diagram showing an exemplary schematic configuration of a DA converter according to a second exemplary embodiment of the present invention.

Explanation will now be given of a second exemplary embodiment of the present invention with reference to the drawings. FIG. 7 is a circuit diagram showing an exemplary schematic configuration of a DA converter 11 according to the present exemplary embodiment. It should be noted that substantially the same configurations and operations in the present exemplary embodiment to that of the first exemplary embodiment are allocated the same reference numerals and detailed explanation thereof is omitted.

The DA converter 11 of the present exemplary embodiment has a resistor Rx inserted into the current path x1 between a current cell 20 and a current-voltage converting section 28, and a resistor Ry inserted into the current path y1 between the current cell 20 and the current-voltage converting section 28. A current Ix flows to the output side of an IV conversion amplifier A1 via the resistor Rx and the feedback resistor R2. A current Iy flows to the output side of the IV conversion amplifier A1 via the resistor Ry. Since a current Ix+Iy is drawn in the amplifier stage 44 of the IV conversion amplifier A1 the current amount is fixed.

The parasitic capacitance occurring in the PMOS transistors Px of the differential switch section 26 does not now appear as output capacitance load of the TV conversion amplifier A1 due to the resistor Rx. In a similar manner, the parasitic capacitance occurring in the PMOS transistors Py does not now appear as output capacitance load of the IV conversion amplifier A1 due to the resistor Ry. Influence of the parasitic capacitance of the PMOS transistors Px and Py on the output of the IV conversion amplifier A1 can be suppressed. Consequently, any reduction in phase margin of the IV conversion amplifier A1 can be suppressed.

As explained above, in the DA converter 11 of the present exemplary embodiment, since the current path x1 and the current path y1 are connected to the output side of the IV conversion amplifier A1, the current amount drawn in the amplifier stage of the IV conversion amplifier A1 is fixed and not related to the decode signals SPx and SPy. There is therefore no detriment to the linearity of the output voltage of the IV conversion amplifier A1, and distortion of the output voltage waveform can be suppressed. Consequently the THD characteristics can be improved. As a specific example, when the current Ix+Iy is from 0 to 300 μA (when the current Ix and the current Iy change between 0 and 300 μA), the THD characteristics of the output voltage of the IV conversion amplifier A1 of the DA converter 11 of the present exemplary embodiment in such a case is −108.5 dB, and the TBD characteristics can be improved.

In the DA converter 11 of the present exemplary embodiment there is the resistor Rx inserted into the current path x1, and the current Ix flows via the resistor Rx into the current-voltage converting section 28. Influence of the parasitic capacitance of the PMOS transistors Px of the differential switch section 26 on the output of the IV conversion amplifier A1 can thereby be suppressed. In a similar manner, the resistor Ry is inserted into the current path y1, and the current Iy flows via the resistor Ry into the current-voltage converting section 28. Influence of the parasitic capacitance of the PMOS transistors Py of the differential switch section 26 on the output of the IV conversion amplifier A1 can thereby be suppressed. Consequently, any reduction in phase margin can be suppressed.

What is claimed is:

1. A DA converter comprising:
   a decoder that decodes a digital decoder input signal into a first decoded signal for causing a first current to flow in a first current path and a second decoded signal for causing a second current to flow in a second current path;
   a differential switch that outputs a current provided from a current source selectively to the first current path and the second current path based on the first decoded signal and the second decoded signal output from the decoder; and
   a current-voltage converting section that outputs an analog signal at a voltage level according to the first current output from the first current path,
   wherein the first current path is connected to an output of the current-voltage converting section via a feedback resistor, and the second current path is connected to the output of the current-voltage converting section, and
   wherein a current amount drawn by the current-voltage converting section is a fixed current equal to the first current plus the second current, and is independent of the first and second decoded signals.

2. The DA converter of claim 1, further comprising a buffer circuit at a stage subsequent the output of the current-voltage converting section.

3. The DA converter of claim 1, further comprising a plurality of the differential switches, wherein the decoder decodes the decoder input signal into a plurality of the first decoded signals corresponding to a number of differential switches and a plurality of the second decoded signals corresponding to the number of differential switches, and outputs the first and second decoded signals respectively to each of the plurality of differential switches.

4. The DA converter of claim 1, wherein the differential switch comprises a plurality of PMOS transistors.

5. The DA converter of claim 1, wherein the differential switch comprises a plurality of NMOS transistors.

6. The DA converter of claim 1, wherein the differential switch comprises a plurality of bipolar transistors.

7. The DA converter of claim 1, further comprising:
   a first resistor connected in the first current path between an output of the differential switch and an input of the current-voltage converting section; and
   a second resistor connected in the second current path between the output of the differential switch and the input of the current-voltage converting section.

8. The DA converter of claim 1, wherein the current-voltage converting section comprises an IV conversion amplifier and a feedback resistor.

9. The DA converter of claim 8, wherein a signal ground is connected to a positive terminal of the IV conversion amplifier, and the first current path is connected to a negative terminal of the IV conversion amplifier.

10. The DA converter of claim 8, wherein a bias ground is connected to a positive terminal of the IV conversion amplifier, and the first current path is connected to a negative terminal of the IV conversion amplifier.

11. A DA converter comprising:
    a decoder that decodes a digital decoder input signal into a first decoded signal for causing a first current to flow in a first current path and a second decoded signal for causing a second current to flow in a second current path;
    a differential switch that outputs a current that provided from a current source selectively to the first current path and the second current path based on the first decoded signal and the second decoded signal output from the decoder;
    a current-voltage converting section that outputs an analog signal at a voltage level according to the first current output from the first current path,
    wherein the first current path is connected to an output of the current-voltage converting section via a feedback resistor, and the second current path is connected to the output of the current-voltage converting section;
    a first resistor having a first end connected to the first current path, and a second end connected to the feedback resistor and an input of the current-voltage converting section; and a second resistor having a first end connected to the second current path, and a second end connected to the output of the current-voltage converting section.

12. The DA converter of claim 11, further comprising a buffer circuit at a stage subsequent the output of the current-voltage converting section.

13. The DA converter of claim 11, further comprising a plurality of the differential switches, wherein the decoder decodes the decoder input signal into a plurality of the first decoded signals corresponding to a number of differential switches and a plurality of the second decoded signals corresponding to the number of differential switches, and outputs the first and second decoded signals respectively to each of the plurality of differential switches.

14. The DA converter of claim 11, wherein the differential switch comprises a plurality of PMOS transistors.

15. The DA converter of claim 11, wherein the differential switch comprises a plurality of NMOS transistors.

16. The DA converter of claim 11, wherein the differential switch comprises a plurality of bipolar transistors.

17. The DA converter of claim 11, wherein the current-voltage converting section comprises an IV conversion amplifier and a feedback resistor.

18. The DA converter of claim 17, wherein a signal ground is connected to a positive terminal of the IV conversion amplifier, and the second end of the first resistor is connected to a negative terminal of the IV conversion amplifier.

19. The DA converter of claim 17, wherein a bias ground is connected to a positive terminal of the IV conversion amplifier, and the second end of the first resistor is connected to a negative terminal of the IV conversion amplifier.

* * * * *